(12) United States Patent
Chang et al.

(10) Patent No.: US 7,824,990 B2
(45) Date of Patent: Nov. 2, 2010

(54) MULTI-METAL-OXIDE HIGH-K GATE DIELECTRICS

(75) Inventors: Vincent S. Chang, Hsinchu (TW); Fong-Yu Yen, Taoyuan County (TW); Peng-Soon Lim, Hsinchu (TW); Jin Ying, Singapore (SG); Hun-Jan Tao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 109 days.

(21) Appl. No.: 11/328,933

(22) Filed: Jan. 10, 2006

(65) Prior Publication Data
US 2007/0128736 A1    Jun. 7, 2007

Related U.S. Application Data

(60) Provisional application No. 60/742,242, filed on Dec. 5, 2005.

(51) Int. Cl.
   *H01L 21/336* (2006.01)
   *H01L 21/31* (2006.01)
(52) U.S. Cl. ............... 438/287; 438/785; 257/E21.489
(58) Field of Classification Search ............. 438/287, 438/785; 257/E21.489
   See application file for complete search history.

(56) References Cited

U.S. PATENT DOCUMENTS

| | | | |
|---|---|---|---|
| 5,708,302 A * | 1/1998 | Azuma et al. | 257/751 |
| 6,355,962 B1 | 3/2002 | Liang et al. | |
| 6,407,435 B1 * | 6/2002 | Ma et al. | 257/411 |
| 6,620,702 B2 | 9/2003 | Shih et al. | |
| 6,706,581 B1 | 3/2004 | Hou et al. | |
| 6,867,101 B1 | 3/2005 | Yu | |
| 6,890,811 B2 | 5/2005 | Hou et al. | |
| 7,138,680 B2 * | 11/2006 | Li et al. | 257/315 |
| 7,282,773 B2 | 10/2007 | Li et al. | |
| 2005/0056900 A1 | 3/2005 | Wang et al. | |
| 2005/0074978 A1 | 4/2005 | Wang et al. | |
| 2005/0124095 A1 | 6/2005 | Liaw | |
| 2005/0151184 A1 | 7/2005 | Lee et al. | |

(Continued)

OTHER PUBLICATIONS

Rhee, S.J., et al., "Improved Electrical and Material Characteristics of Hafnium Titanate Multi-Metal Oxide n-MOSFETs with Ultra-Thin EOT (~8Å) Gate Dielectric Application," IEEE, 2004, 4 pages.

(Continued)

*Primary Examiner*—Lex Malsawma
(74) *Attorney, Agent, or Firm*—Slater & Matsil, L.L.P.

(57) ABSTRACT

A semiconductor structure having a high-k dielectric and its method of manufacture is provided. A method includes forming a first dielectric layer over the substrate, a metal layer over the first dielectric layer, and a second dielectric layer over the metal layer. A method further includes annealing the substrate in an oxidizing ambient until the three layers form a homogenous high-k dielectric layer. Forming the first and second dielectric layers comprises a non-plasma deposition process such atomic layer deposition (ALD), or chemical vapor deposition (CVD). A semiconductor device having a high-k dielectric comprises an amorphous high-k dielectric layer, wherein the amorphous high-k dielectric layer comprises a first oxidized metal and a second oxidized metal. The atomic ratios of all oxidized metals are substantially uniformly within the amorphous high-k dielectric layer.

21 Claims, 10 Drawing Sheets

U.S. PATENT DOCUMENTS

2006/0105530 A1*  5/2006  Lai et al. .................. 438/287

OTHER PUBLICATIONS

Yu, X., et al., "Improvements on Surface Carrier Mobility and Electrical Stability of MOSFETs Using HfTaO Gate Dielectric," IEEE Transactions on Electron Devices, vol. 51, No. 12, pp. 2145-2160, Dec. 2004.

Rhee, S.J., et al., "Optimization and Reliability Characteristics of $TiO_2/HfO_2$ Multi-metal Dielectric MOSFETs," 2005 Symposium on VLSI Technology Digest of Technical Papers, IEEE, pp. 168-169.

Lu, N., et al., "Electrical Properties of Amorphous High-$k$ HfTaTiO Gate Dielectric With Dielectric Constants of 40-60," IEEE Electron Device Letters, vol. 26, No. 5, May 2005, pp. 298-300.

* cited by examiner

MULTI-METAL-OXIDE HIGH-K GATE DIELECTRICS

This application claims the benefit of U.S. Provisional Application No. 60/742,242 entitled "Multi-Metal-Oxide High-K Gate Dielectrics," filed Dec. 5, 2005, which application is hereby incorporated by reference in its entirety.

TECHNICAL FIELD

This invention relates generally to the fabrication of semiconductor devices, and more particularly to transistors made with high-k gate dielectrics.

BACKGROUND

As integrated circuit feature sizes decrease, the gate dielectric thickness of field effect transistors (FETs) also decreases. This decrease is driven in part by the demands of overall device scaling. As gate conductor widths decrease, for example, other device dimensions decrease to maintain the proper device scale, and thus device operation. Another factor driving gate dielectric thickness reduction is the increased transistor drain current realized from a reduced gate dielectric thickness. The transistor drain current is proportional to the amount of charge induced in the transistor channel region by the voltage applied to the gate conductor. The amount of charge induced by a given voltage drop across the dielectric is a factor of the capacitance of the gate dielectric.

In order to achieve increased capacitance, gate dielectrics made from oxides such as $SiO_x$ are now as thin as 10 Å. These extremely thin gate oxides result in increased gate-to-channel leakage current, however. Problems such as this have led to the use of materials that have dielectric constants that are greater than the dielectric constant of silicon oxide, which has a k value of about 3.9. Higher k values, for example 20 or more, may be obtained with various transition metal oxides. These high-k materials allow high capacitances to be achieved with relatively thick dielectric layers. In this manner, the reliability problems associated with very thin dielectric layers can be avoided while improving transistor performance.

There are, however, fabrication problems associated with forming gate dielectric layers that include high-k materials. For example, processing high-k dielectric layers in the presence of oxygen at elevated temperatures detrimentally affects high-k dielectric films by causing the film to crystallize and also by forming interfacial layers within the high-k film. Another problem associated with the above-mentioned high-k dielectrics is that the forming of a crystalline structure leads to a roughened film surface and unevenly distributed grain boundaries. Surface roughness causes non-uniform electrical fields in the channel region adjacent the dielectric film. Unevenly distributed grain boundaries cause variations in the gate leakage current across the wafer. Such problems degrade MOSFET performance.

For example, damaged dielectric materials may contain a greater number of bulk traps and interface traps than gate dielectrics made from thermally grown $SiO_2$. Traps adversely affect both sub-threshold slope and threshold voltage ($V_t$). High trap density also leads to leakage through Frenkel-Poole tunneling, and it causes bias temperature instability. Problems relating to flatband voltage ($V_{fb}$) shift also occur.

In light of problems such as these, there is a need to develop improved methods and structures involving high-k gate dielectrics and related semiconductor devices that overcome the shortcomings of the prior art.

SUMMARY OF THE INVENTION

These and other problems are generally solved or circumvented, and technical advantages are generally achieved by preferred embodiments of the present invention that provide a novel process and structure for semiconductor devices using high-k gate dielectric materials. Embodiments of the invention use a sequential ALD, PVD, ALD process for adding amorphous-stabilizing dopants to high-k dielectric layers. A preferred embodiment comprises a two-dopant, or a co-doping, process. Such an ALD, PVD, ALD, co-doping process may conveniently be called the APAC process.

An embodiment of the invention provides a method of forming a high-k dielectric layer. A method comprises, forming a first dielectric layer over a substrate, a metal layer over the first dielectric layer, and forming a second dielectric layer over the metal layer. Preferred embodiments include annealing the substrate in an oxidizing ambient until the first dielectric layer, the metal layer, and the second dielectric layer combine and form a homogenous high-k dielectric layer. Preferably, the homogenous high-k dielectric layer is substantially amorphous.

The oxidizing ambient may comprise $O_2$, $O_3$, $N_2O$, or $NO_x$ and maintaining a temperature less than about 1000° C. The first and second dielectric layers may be formed using a non-plasma deposition process such as atomic layer deposition (ALD), and chemical vapor deposition (CVD). Forming the metal layer may comprise using a plasma vapor deposition and ALD processes. Other embodiments may include forming a second metal layer between the first metal layer and the second dielectric layer. The first and second metal layers may comprise metals such as Ti, Ta, Zr, or other doping materials. The first and second metal layers may also comprise two or more other metal doping materials. An atomic ratio of the first metal to the second ratio is between about 3:7 and 7:3. The first and second metal layers may have a thickness ratio between about 3:7 and 7:3.

Another embodiment of the invention provides a method of forming a semiconductor structure on a substrate. The method comprises forming an interfacial layer over the substrate, forming a first high-k dielectric layer over the substrate using an atomic layer deposition (ALD) process. The method may further comprise forming a metal layer over the first high-k dielectric layer, and forming a second high-k dielectric layer over the first metal layer using an ALD process.

The method may further comprise annealing the substrate in an oxidizing ambient until the first high-k dielectric layer, the first metal layer, and the second high-k dielectric layer form a homogenous high-k dielectric layer. Preferably, the annealing oxidizes the first metal layer thereby forming an oxidized metal, wherein the oxidized metal has a dielectric constant equal to or greater than the first high-k dielectric layer. The first and second high-k dielectric layers preferably have different respective dielectric constants.

Yet another embodiment provides a method of forming a semiconductor device having a high-k dielectric. The method comprises forming an interfacial layer over a substrate, and forming a homogenous high-k dielectric layer over the interfacial layer. In preferred embodiments of the invention, the homogenous high-k dielectric layer comprises a first oxidized metal and a second oxidized metal wherein an atomic ratio of the first oxidized metal to the second oxidized metal is substantially uniform within the homogenous high-k dielectric layer.

Still another embodiment provides an apparatus for forming semiconductor structure. The apparatus comprises a first module and a second module for forming high k dielectric layers by an atomic layer deposition (ALD) process. The apparatus may further comprise a third module for forming metal layer by ALD, chemical vapor deposition (CVD) or a plasma vapor deposition (PVD) process The dielectric layers may include materials HfSiON, $HfO_2$, $Ta_2O_5$, $TiO_2$, $Al_2O_3$, $ZrO_2$, $Y_2O_3$, $La_2O_3$, $HfSiO_x$, $HfAlO_x$, $PbTiO_3$, $BaTiO_3$, $SrTiO_3$, $PbZrO_3$, rare-earth oxides, scandates, aluminates and silicates thereof, as well as combinations thereof. Suitable substrates may include Si, Ge, SiC, SiGe, SOI, GOI, GaAs, and combinations thereof.

Still other embodiments of the invention may include forming an interfacial layer less than about 30 Å thick between the substrate and the first dielectric layer. Preferably, the interfacial layer is formed using SiN, SiO, $SiO_2$, SiON, Si, Hf, Al, Zr, Ti, Ta, La, Y, and combinations thereof.

Another preferred embodiment of the invention comprises forming an interfacial layer over the substrate, forming a first high-k dielectric layer over the substrate using an atomic layer deposition process, forming a first metal layer over the first high-k dielectric layer; and forming a second high-k dielectric layer over the first metal layer using the atomic layer deposition process. Embodiments may include annealing the substrate in an oxidizing ambient so that the oxidized metal has a dielectric constant substantially more than the first high-k dielectric layer.

Yet other embodiments of the invention provide semiconductor structures and devices having a high-k dielectric layer. An embodiment comprises an amorphous high-k dielectric layer over the substrate. The amorphous high-k dielectric layer preferably comprises a first oxidized metal and a second oxidized metal, wherein an atomic ratio of the first oxidized metal to the second oxidized is substantially uniformly within the amorphous high-k dielectric layer. Preferably, the homogenous high-k dielectric layer is between about 10 Å and about 100 Å thick.

In other embodiments, each one of the first dielectric layer, the second dielectric layer, and the metal layer are between about 10 Å and 30 Å thick. In preferred embodiments of the invention the semiconductor device comprises a MOSFET.

Note that although the term layer is used throughout the specification and in the claims, the resulting features formed using the layer should not be interpreted as only a continuous or uninterrupted feature. As will be clear from reading the specification, the semiconductor layer may be separated into distinct and isolated features (e.g., active regions), some or all of which comprise portions of the semiconductor layer.

Additional features and advantages of embodiments of the invention will be described hereinafter, which form the subject of the claims of the invention. It should be appreciated by those skilled in the art that the specific embodiments disclosed might be readily utilized as a basis for modifying or designing other structures or processes for carrying out the purposes of the present invention. It should also be realized by those skilled in the art that such equivalent constructions and variations on the example embodiments described do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 7b is process flow diagram corresponding to the embodiment of the invention in FIG. 7a;

FIG. 8b is process flow diagram corresponding to the embodiment of the invention in FIG. 8a.

Corresponding numerals and symbols in the different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The operation and fabrication of the presently preferred embodiments are discussed in detail below. However, the embodiments and examples described herein are not the only applications or uses contemplated for the invention. The specific embodiments discussed are merely illustrative of specific ways to make and use the invention, and do not limit the scope of the invention or the appended claims.

Exemplary structures and methods are provided below for fabricating a metal oxide semiconductor field effect transistor (MOSFET) according to embodiments of the invention. Although the exemplary embodiments are described as a series of steps, it will be appreciated that this is for illustration and not for the purpose of limitation. For example, some steps may occur in a different order than illustrated yet remain within the scope of the invention. In addition, not all illustrated steps may be required to implement the present invention. Furthermore, the structures and methods according to embodiments of the invention may be implemented in association with the fabrication or processing of other semiconductor structures not illustrated.

Figure 1A:
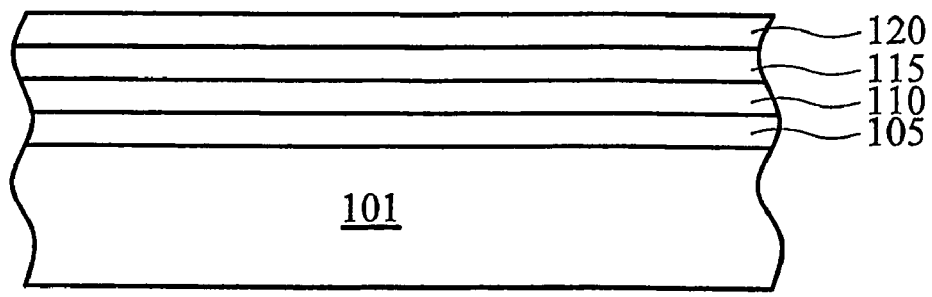
FIGS. 1a and 1b are cross-sectional views of a pre-anneal, high-k dielectric for an embodiment of the invention.

Preferred embodiments of the invention provide a method of forming a high-k dielectric layer over a substrate. FIG. 1a depicts a cross sectional view of a semiconductor devices such as a MOSFET at an intermediate fabrication stage. A semiconductor substrate 101 is preferably a silicon wafer, although the substrate 101 may alternatively comprise Ge, SiGe, strained silicon, strained SiGe, strained germanium, GaAs, silicon on insulator (SOI), germanium on insulator (GOI), a combination, or a stacked arrangement of layers such as Si/SiGe.

An interfacial layer (IL) 105 such as such as SiN, SiO, $SiO_2$, SiON, Si, Hf, Al, Zr, Ti, Ta, La, Y, or combinations thereof, is optionally formed over the substrate 101, as a result of a deposition or wafer cleaning processes. Suitable deposition methods include thermal oxidation, low temperature CVD, plasma enhanced CVD, plasma-enhanced oxidation, or other methods. The interfacial layer 105 is preferably less than about 30 Å thick, and more preferably less than about 10 Å thick. In one embodiment, an $SiO_2$ interfacial layer 105 is formed by exposing the silicon substrate 101 to an oxygen atmosphere or an oxidative solution thereby forming a native or chemical oxide, respectively. In another embodiment, a metal oxide interfacial layer 105 is formed by depositing metal oxide on Si substrate using non-plasma deposition methods such as ALD or CVD, or by oxidation of the metal dopants diffusing from the metal layer 115 during the subsequent oxidizing anneal 125.

A first dielectric layer 110 is formed over the silicon substrate 101 after the optionally formed interfacial layer 105 is formed. Preferred dielectrics include high-k dielectrics, which includes the group of dielectrics having a dielectric constant k greater than silicon dioxide, or about 3.9. Suitable high-k dielectrics include $Ta_2O_5$, $TiO_2$, $Al_2O_3$, $ZrO_2$, $HfO_2$, $Y_2O_3$, rare-earth oxides such as $La_2O_3$, rare-earth scandates such as $DyScO_3$, and their aluminates and silicates, or combinations thereof. Other high-k dielectrics may include $HfSiO_x$, $HfAlO_x$, HfSiON, barium strontium compounds such as BST, lead based compounds such as $PbTiO_3$, similar compounds such as $BaTiO_3$, $SrTiO_3$, $PbZrO_3$, PST, PZN, PZT, PMN, metal oxides, metal silicates, metal nitrides, combinations and multiple layers of these. The first dielectric 110 may further include Si, Ge, F, C, B, O, Al, Ti, Ta, La, Ce, Bi, W, or Zr, for example.

In embodiments of the invention, the first high-k dielectric layer 110 is typically 1 to 100 Å thick, preferably less than about 50 Å. A non-plasma process is preferably used to form the first dielectric layer 110. This is to avoid forming defects generated by plasma-damaged surfaces. Suitable processes include evaporation-deposition, sputtering, CVD, MOCVD, and ALD. For example in a MOCVD process, a liquid metal-organic precursor is vaporized and provided over a process wafer substrate at a pressure of about 0.25 Torr to about 10 Torr, more preferably about 100 mTorr to about 500 mTorr, to dissociate on the substrate surface in an oxidizing ambient to form the high-k metal oxide. The MOCVD deposition process preferably takes place with the wafer substrate heated to between about 350° C. and about 800° C.

A more preferred process, however, is the ALD process. With ALD, layers are sequentially deposited including a molecular layer of metal precursor, for example a metal-organic precursor or a metal halide precursor, followed by controlled ligand exchange of the metal-organic or metal-halide molecular layer to form a portion of the high-k dielectric layer. The process is repeated to form a suitably thick layer.

Next, a metal layer 115 is formed over the first dielectric layer 110. The metal layer 115 may include Hf, Zr, Ti, Ta, Al, alloys thereof, and/or other materials. It may be formed by CVD, PECVD, PVD, ALD, and/or other processes. The metal layer 115 may also be formed by selective deposition or blanket deposition followed by a patterning process. Preferably, the metal layer 115 is formed by PVD. Also, preferably, the metal layer could be formed by ALD process. And it is typically less than about 100 Å, preferably less than about 50 Å.

Figure 1B:
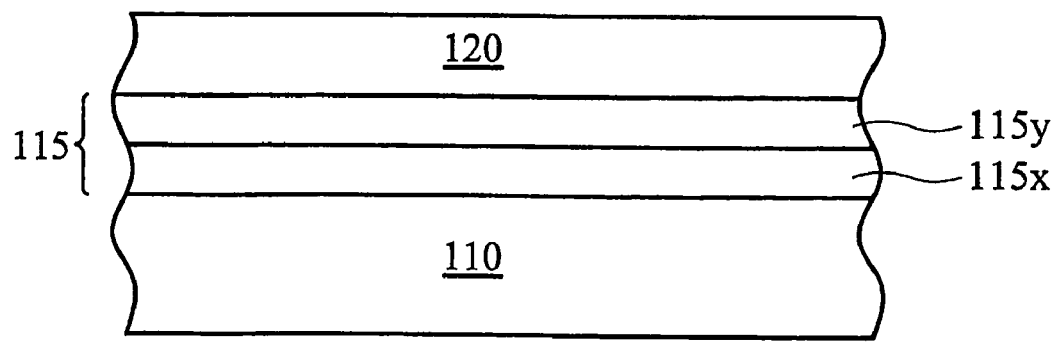

The metal layer 115 may comprise a plurality of two or more combined metals arranged substantially single layer as illustrated in FIG. 1a. In other embodiments, such as illustrated in FIG. 1b, the metal layer 115 comprises a plurality of layers such as a first metal layer 115x and a second metal layer 115y. In an example of an embodiment of the invention, the first metal layer 115x comprised Ti, and the second metal layer 115y comprised Ta. The first and second metal layers, 115x and 115y, may have a thickness ratio between about 3:7 and 7:3.

Referring once again to FIG. 1a, formed over the metal layer 115 is a second dielectric layer 120. The second dielectric layer 120 may be formed using the same methods and specifications as provided for the first dielectric layer 110; however, unlike the first dielectric layer 110, formation of the second dielectric layer 120 is not preferably limited to non-plasma processes. This is because the first dielectric layer 110 and the metal layer 115 sufficiently protect the substrate from plasma processing damage often caused by methods such as plasma enhanced CVD (PECVD) or ALD (PEALD). Therefore, in an embodiment of the invention, the dielectric constant of the first and second dielectric layers, 110 and 120, are different.

Figure 2:
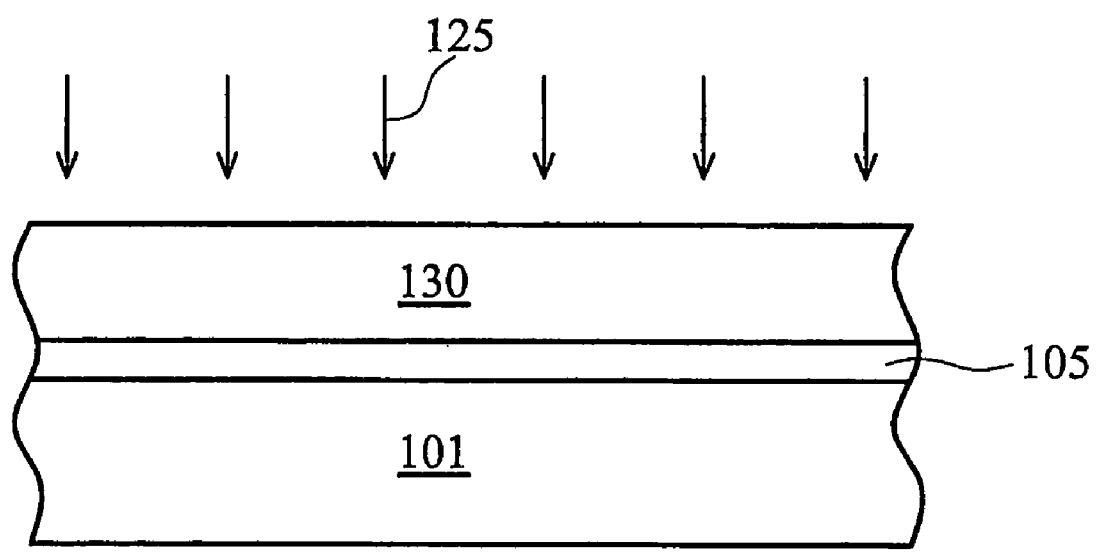
FIG. 2 is a cross-sectional view of the post-anneal, high-k dielectric.

The intermediate structure of FIG. 1a is next annealed, which is symbolized by the arrows 125 in FIG. 2. The annealing 125 preferably includes rapid thermal anneal (RTA) in an oxidizing ambient to convert the first and second dielectric layers, 110 and 120, and the metal layer 115 (FIG. 1a) into a homogeneous, high-k dielectric 130, as illustrated in FIG. 2. The annealing oxidizes the metal layer 115 thereby forming an oxidized metal, wherein the oxidized metal has a dielectric constant equal to or greater than the first high-k dielectric layer 110.

In preferred embodiments of the invention, there are substantially no internal interfaces within the high-k dielectric 130 remaining from the pre-annealed structure. Applicants theorize that the second dielectric layer may control the oxidation and transport of metals within the metal layer. Applicants found that the dielectric/metal/dielectric structure, especially the ALD/PVD/ALD tri-layer structure, advantageously forms the homogeneous dielectric 130.

In one example, the first and second dielectric layers were each comprised of $HfO_2$ about 17 Å thick and the metal layer comprised Ti about 19 Å thick. The annealing 125 yielded an HfTiO, homogeneous, dielectric layer about 48 Å thick.

Figure 3A:
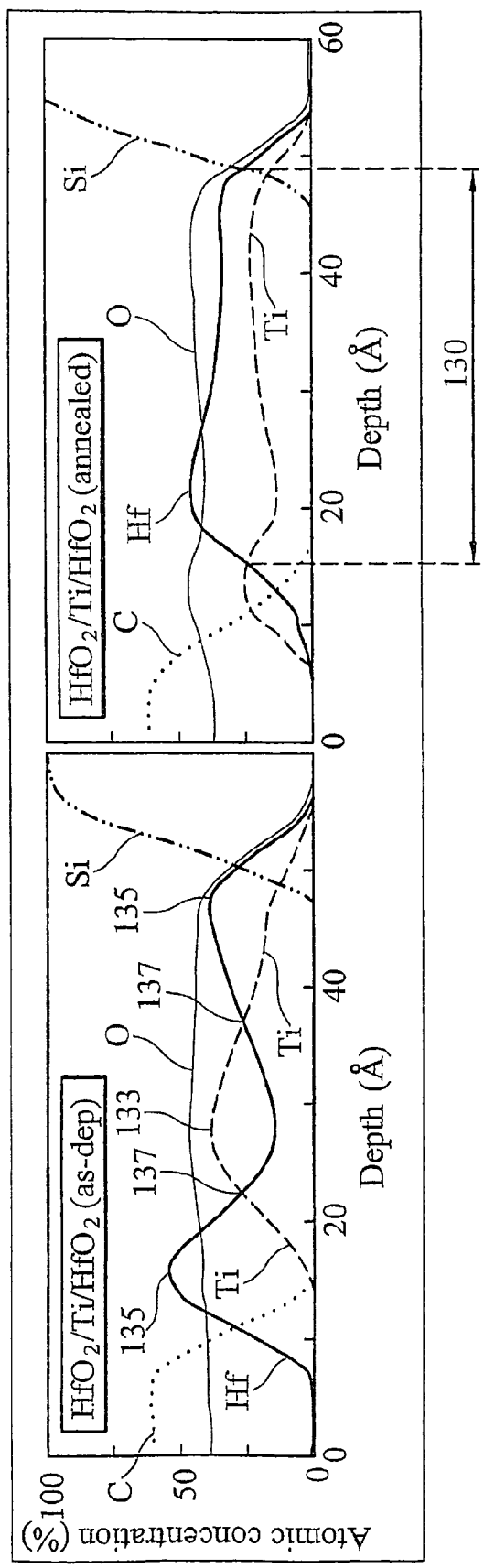
FIGS. 3a and 3b compare AR-XPS data for pre-anneal and post-anneal samples of a $HfO_2$/Ti bi-layer and a HfO2/Ti/$HfO_2$ tri-layer for embodiments of the invention.
Figure 3B:
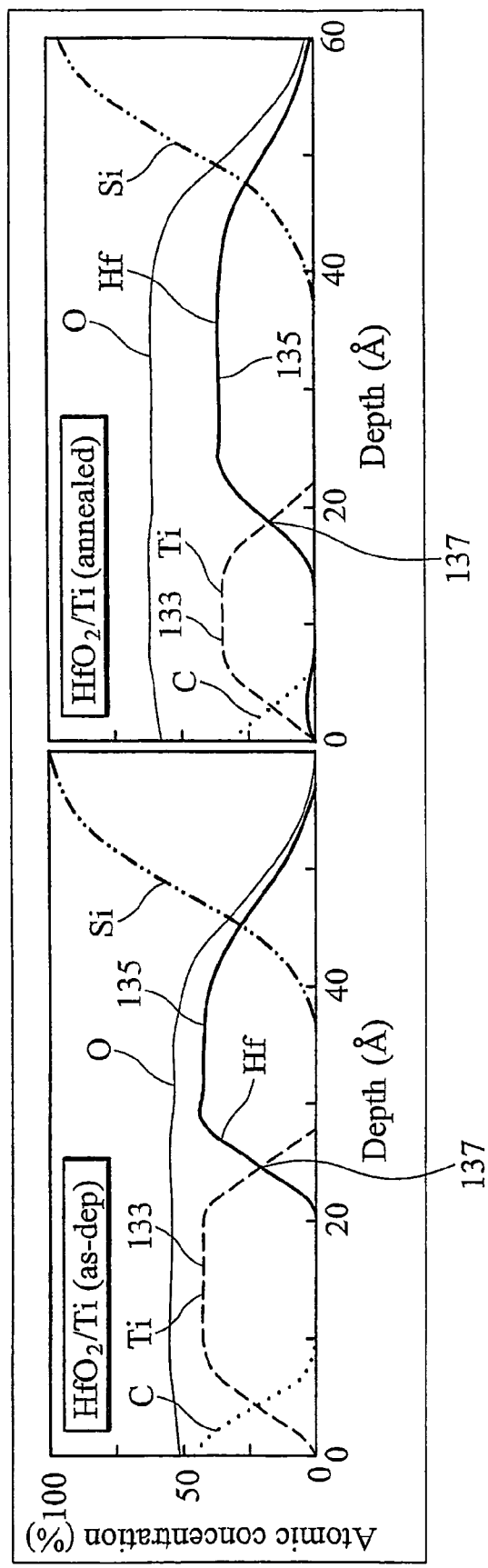

FIGS. 3a and 3b compare the angle-resolved x-ray photoelectron spectroscopy (AR-XPS) data for pre-anneal and post-anneal samples of a $HfO_2$/Ti bi-layer (FIG. 3b) and a HfO2/Ti/$HfO_2$ (FIG. 3a). In FIG. 3b, there is a single Ti peak 133 and a single Hf peak 135 for the as-deposited sample. Also in FIG. 3b, the Ti peak 133 and a single Hf peak 135 are separated by a clearly defined interface 137, indicating a bi-layer structure. The same features are also observed in the annealed $HfO_2$/Ti bi-layer sample of the FIG. 3b. This indicates that the bi-layer structure failed to rearrange into a homogeneous layer during annealing. As noted above, such a structure is not preferred for high-performance devices because of the traps associated with the interface within the bi-layer.

This contrasts with the annealing behavior of the $HfO_2$/Ti/$HfO_2$ tri-layer sample observed in FIG. 3a. As with the bi-layer structure, the pre-anneal sample displays Hf and Ti peaks, 135 and 133, corresponding to a multi-layer structure. However, the post-anneal AR-XPS curves for Hf and Ti indicate removal of the interface 137 and formation of the preferred homogeneous, high-k dielectric 130.

Figure 4:
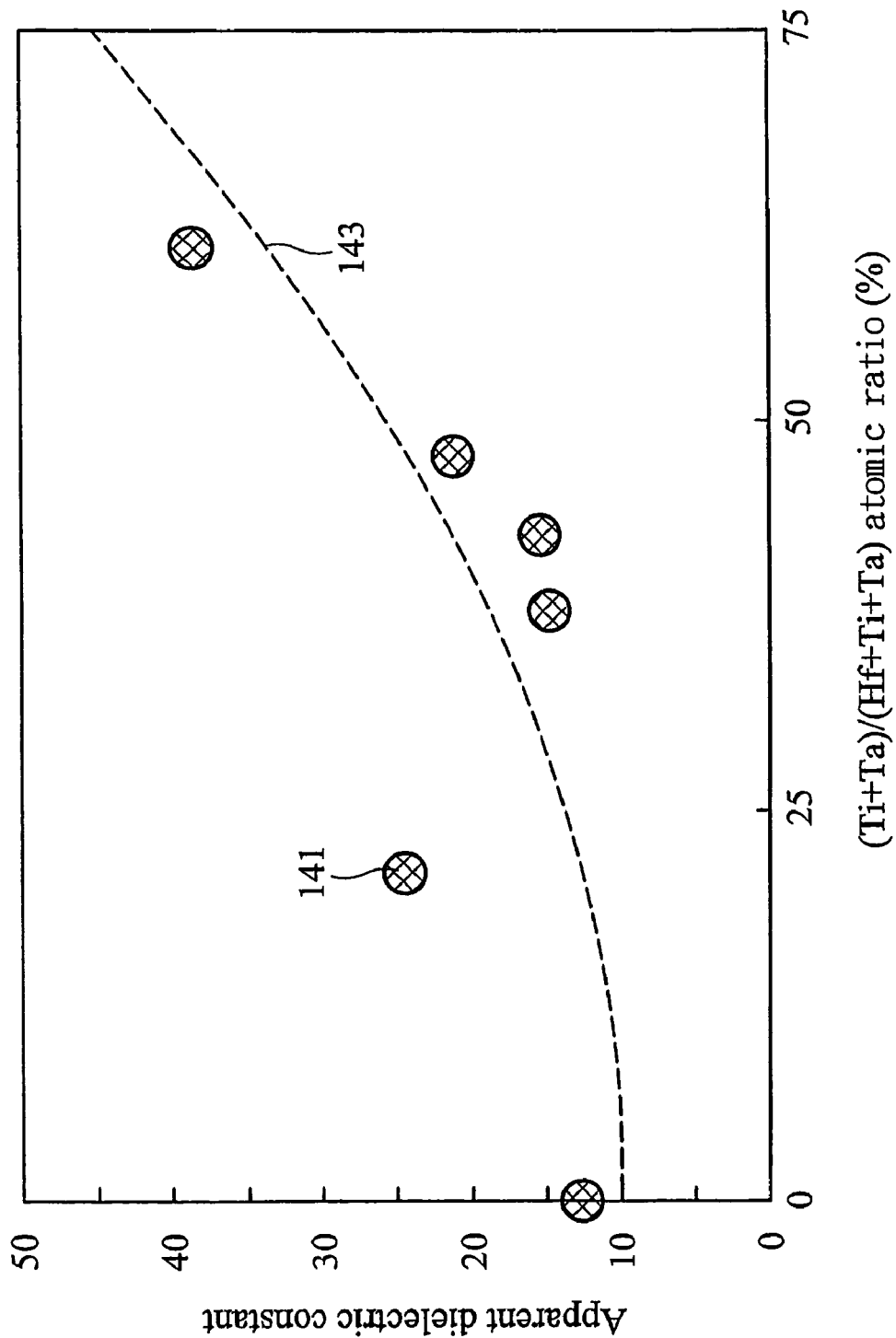
FIG. 4 is a data plot of apparent dielectric constant vs. Ta and Ti content for embodiments of the invention.

In another embodiment of the invention the metal layer comprised a co-doping combination of Ti and Ta. Applicants discovered that the apparent dielectric constant of the dielectric layer 130 increased from about 13 to about 38 when the (Ti+Ta)/(Hf+Ti+Ta) atomic ratio increased from about 0% to about 61%. A plot of apparent dielectric constant measurements 141 versus atomic ratio is shown in FIG. 4. A proposed curve-fit of the measurements 141 is indicated by a dashed line 143.

Applicants find that embodiments comprising Ti/Ta co-doping are particularly preferred for increasing thermal stability and preventing crystallization of the amorphous dielectric layer 130. FIGS. 5a-5d are plots of x-ray diffraction spectra (XRD) for various as-deposited (As-dep) and annealed samples as a function of temperature and Ti/Ta doping. The presence of the crystalline dielectric phase is indicated by a (111) diffraction peak 147 in the XRD spectrum. A substantially completely amorphous dielectric phase is indicated by the absence of the (111) diffraction peak 147.

Figure 5A:
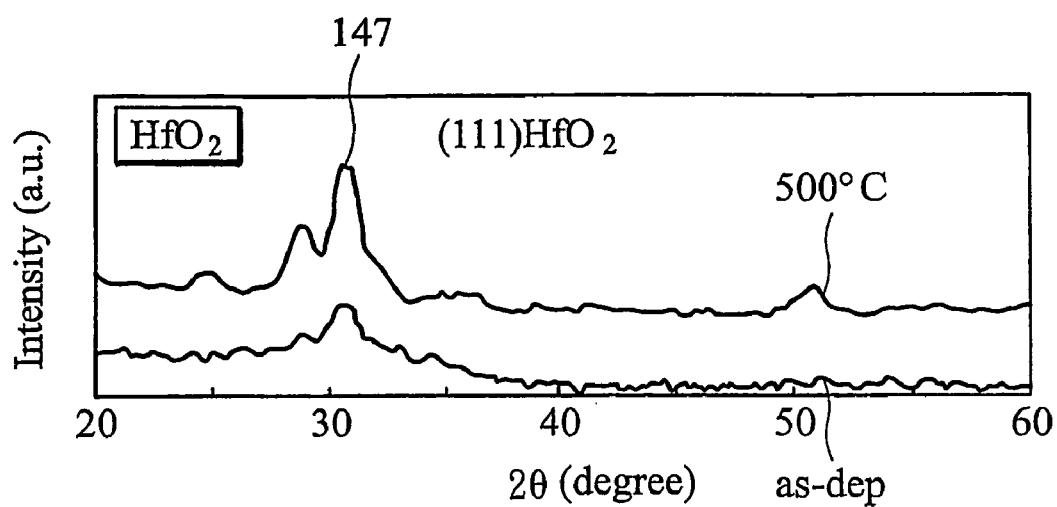
FIGS. 5a-5d compare x-ray diffraction data that shows the effect of metal doping on temperature stability of an amorphous dielectric.
Figure 5B:
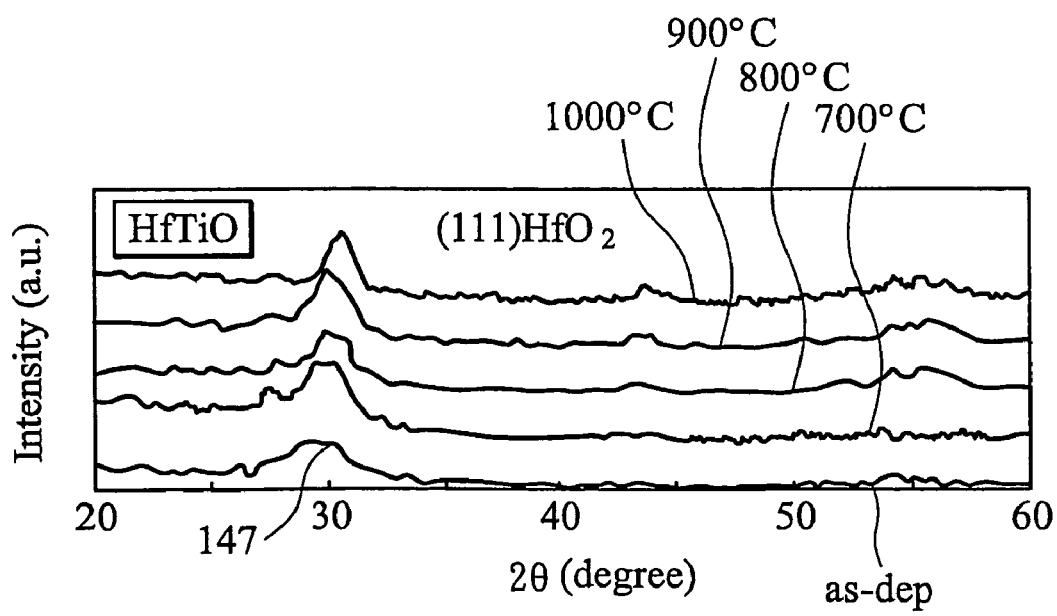
Figure 5C:
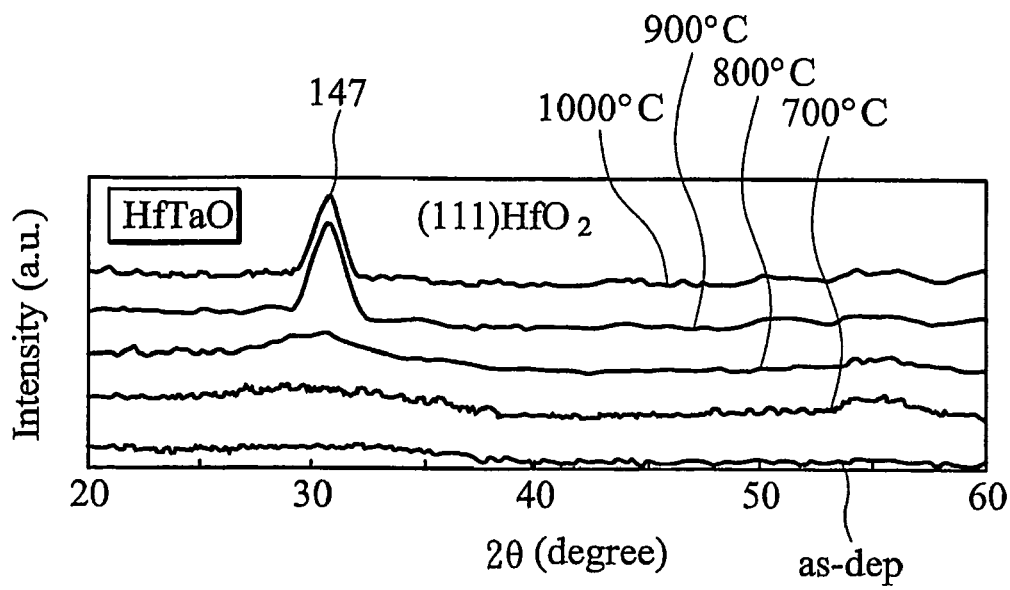

As shown in FIG. 5a, the (111) diffraction peak 147 is observed for the 500° C. annealed $HfO_2$ samples as well as in the as-deposited samples. As for the HfTiO samples, FIG. 5b shows that there is also a diffraction peak 147; however, the magnitude of the peak is lower. This indicates that the amount of crystallization in the HfTiO samples was reduced relative to undoped $HfO_2$. As noted, the amount of crystallization is lowered because metal doping stabilizes the amorphous phase of the high-k dielectric. Likewise, FIG. 5c shows a still lower (111) diffraction peak 147 with HfTaO samples, indicating that Ta may be more effective than Ti in preventing crystallization. Applicants found even more improved results with Ta/Ti co-doping.

Figure 5D:
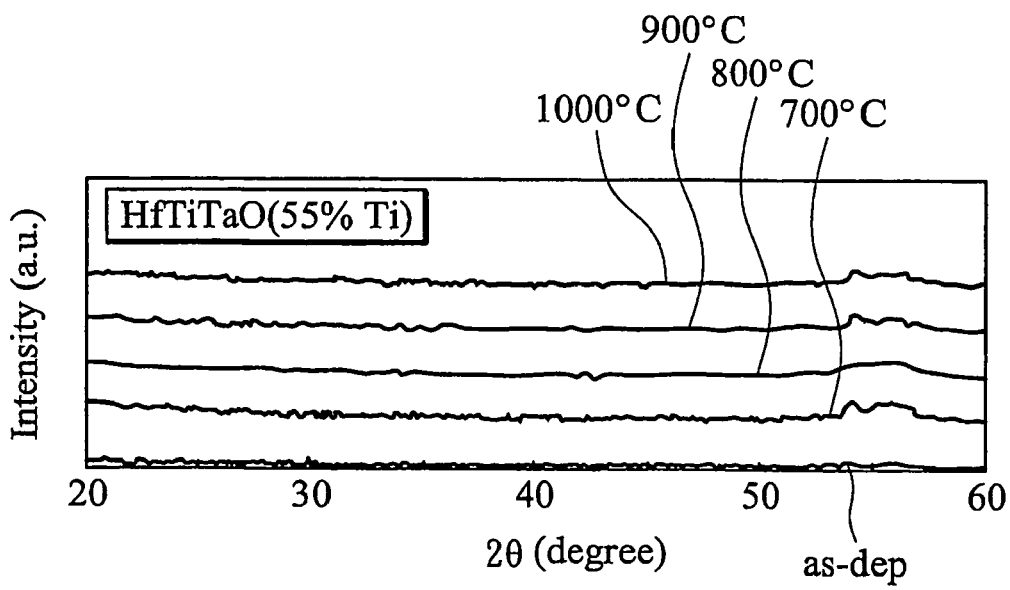

FIG. 5d shows the XRD spectra for HfTiTaO samples wherein the atomic fraction of Ti, Ti/(Ti+Ta), is about 0.55. As shown by FIG. 5d, HfTiTaO comprising 55% Ti among Ti+Ta is stable even up to about 1000° C. Such stability is indicated by the absence of a (111) XRD diffraction peak in the spectra of FIG. 5d. In one embodiment, the atomic ratio of Ti:Ta (first metal to second metal) is preferably between 3:7 to 7:3 such that the HfTiTaO would remain amorphous after a post anneal up to 1000° C.

In another embodiment, the atomic ratio and/or the thickness ratio of Ti:Ta is preferably between about 4:6 to about 6:4 such that the HfTiTaO would remain amorphous after a post anneal up to 1000° C.

In describing embodiments of the invention, Applicants do not intend to limit the invention to an implied or proposed theory of operation. Any such theory is offered as an aid for understanding the invention and not for limiting its scope. In light of these considerations, Applicants propose that the second dielectric layer in the tri-layer structure limits oxygen transport during annealing much like an oxygen barrier. By limiting oxygen transport, metals have time to diffuse from the metal layer into adjacent dielectric layers before being oxidized. In the bi-layer structure, by contrast, metals are more rapidly oxidized during annealing. Because the diffusion coefficient of metal oxides is generally much lower than the free metal, the bi-layer structure is not converted into a homogeneous film by annealing.

In preferred embodiments of the invention, the annealing preferably comprises a high temperature, oxidizing environment. The oxidizing ambient may include an oxidizing agent such as $O_2$, $O_3$, $N_2O$, $NO_x$, or combinations thereof. During the dielectric forming and the annealing 125 of the substrate 101, the process temperature is maintained sufficiently low to prevent the dielectric, which is preferably amorphous, from crystallizing. Preferably, the temperature is maintained below about 1000° C. and more preferably between about 400° C. and 800° C. A preferred set of annealing conditions may comprise a annealing at about 700° C. for about 80 s in about 0.1% $O_2$ in $N_2$.

Figure 6:
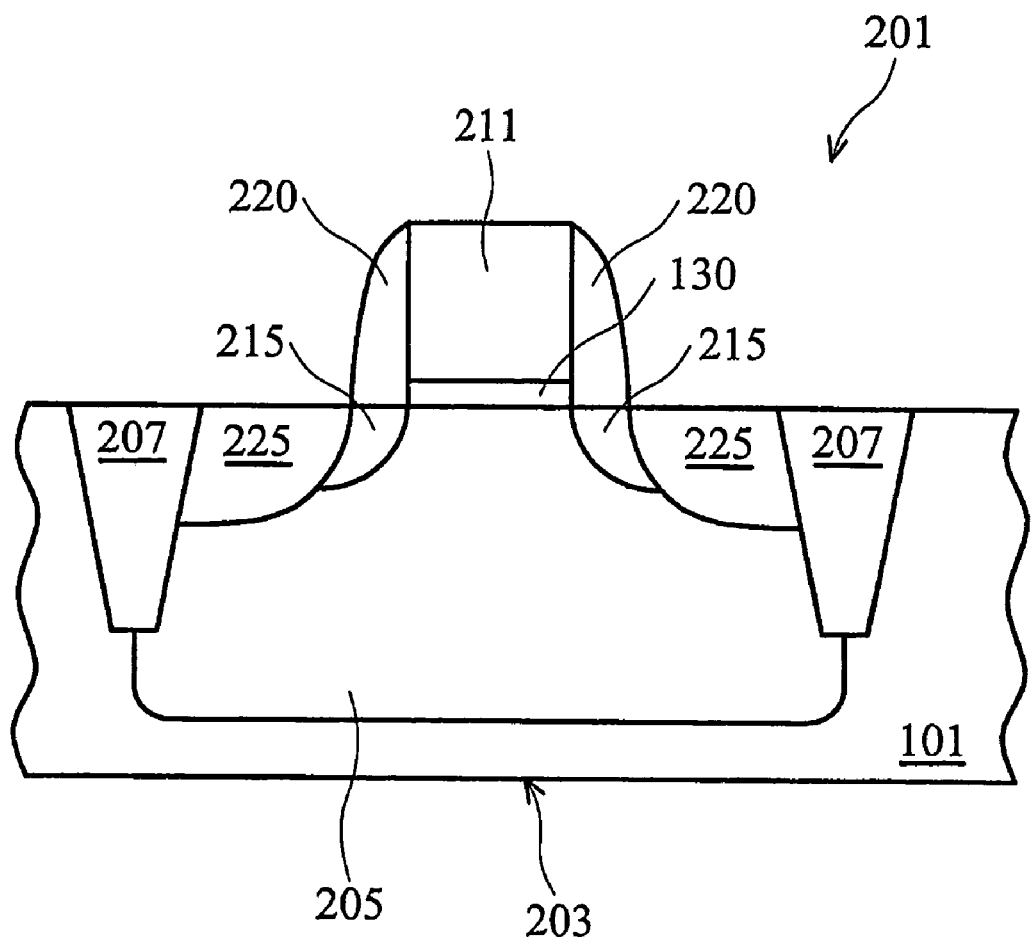
FIG. 6 is a cross-sectional view of a MOSFET manufactured according to preferred embodiments of the present invention.

Turning now to FIG. 6, the intermediate structure of FIG. 2 may be completed according to conventional semiconductor fabrication methods, which may include several of the following steps. For example, the completing the intermediate structure of FIG. 2 may include forming an MOSFET 201 in an active region 203, i.e., a region for device fabrication, within the substrate 101. The active region 203 may include a well region 205 having about 1E20 cm-3 dopant of polarity opposite the channel region of the corresponding MOS device to be formed. Over the active region 203, is an amorphous, high-k gate dielectric 130 formed according to embodiments of the invention. An isolation structure, such as shallow trench isolation (STI) regions 207, may be formed within the substrate 101 to isolate and active regions 205. STI regions 121 are formed using conventional thermal growth methods and isolation region deposition and patterning methods. A gate electrode 211 is formed over the homogenous, high-k dielectric layer 130. The gate electrode 211 may comprise CVD polysilicon between about 500 and 2,000 angstroms thick. The gate electrode 211 may further include about 1E20 cm-3 dopant of polarity opposite the channel region of the corresponding MOS device to be formed. Such doping advantageously provides for enhanced off current (Ioff) performance, enhanced drain saturation current (Idsat) performance and possibly enhanced short channel effect (SCE) performance of a field effect transistor (FET) device formed employing a gate electrode formed from the patterned gate electrode 211. In other embodiments, the gate electrode 211 comprises a metal gate electrode. The metal gate electrode may comprise a metal or metal alloy such as Ru or W, a meal compound such as TiN, TaN, TaC, or $Mo_2N$, or a metal silicide such as NiSi or MoSi, which may be formed using PVD, ALD, or PECVD, for example.

Using the gate electrode 211, as a mask, lightly doped source/drain (LDS/LDD) regions 215 are formed in the substrate 101 to a depth between about 100 and about 1000 angstroms and preferably between about 200 and about 400 angstroms. For example, an N-LDS/LDD region 215 is formed by ion implanting phosphorus or arsenic dopant ions from about 1 E 13 ions/cm2 to about 5 E 14 ions/cm2 at an energy from about 30 keV to about 80 keV. After annealing the concentration of phosphorus or arsenic dopant in the LDS/LDD regions 215 is from about 5 E 16 atoms/cm3 to about 1 E 19 atoms/cm3.

Dielectric sidewall spacers 220 are deposited using a non-high-k dielectric to provide a protective spacer over the sidewalls of the electrode. The sidewall spacers 220 are preferably a nitrogen-containing oxide, silicon nitride, oxide or a stacked combination thereof. The sidewall spacers 220 may be deposited by low temperature deposition techniques including LPCVD, PECVD and remote plasma CVD (RPCVD). The sidewall spacers 220 may comprise silicon nitride or silicon oxynitrides. In a preferred embodiment the oxide or nitride sidewall spacer 220 may be more than about 40 nm wide. In an example, the sidewall spacers 220 are $SiO_xN_y$, nitride or a stacked combination thereof.

Using the gate electrode and sidewall spacers as a mask, there are formed heavily doped source/drain regions 225. An N+ source/drain implant may comprise a dose of phosphorus or arsenic dopant between about 1 E 14 ions/cm$^2$ and 1 E 16 ions/cm$^2$ at an energy between about 10 keV and 80 keV. After annealing, the concentration of phosphorus or arsenic dopant in the regions 225 is preferably between about 5 E 18 atoms/cm$^3$ and 5 E 20 atoms/cm$^3$.

Silicide regions (not shown) are formed on the gate electrode 211 and above heavily doped S/D regions 225. Contacts can then be made to silicide regions from an overlying conductive layer in subsequent processing. The result is that structure 201, which comprises a high-performance N-MOS-FET demonstrating superior performance compared to the prior art.

To assist one skilled in the art in appreciating the scope of the invention, Applicants summarize below several representative examples of the enhancements exhibited by NMOS transistors fabricating according to embodiments of the invention. Applicants found that the stress-induced Vt shifts of Ti/Ta-doped $HfO_2$ were 1-2 orders smaller than those of undoped HfO2. The Ti/(Ti+Ta) ratios of 38% and 55% resulted in small Vt shifts (2 mV), indicating that the electron traps were significantly reduced by the APAC technique. The electron mobility of HfO2 was substantially enhanced by Ti/Ta doping (70-170% increase for peak mobility). The high-field mobility at 1 MV/cm of Ti/Ta-doped $HfO_2$ ranged from 74 to 96% of the universal curve, which was about twice that of undoped HfO2 (41%). The effects of the Ti/(Ti+Ta) atomic ratios on Vt shift and mobility were consistent, therefore suggesting that the mobility enhancement results from suppressed electron traps.

Figure 7A:
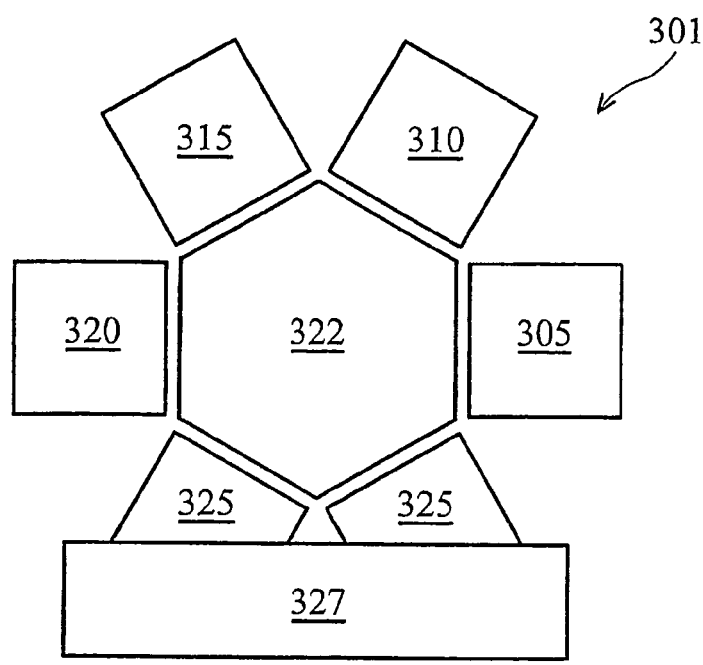
FIG. 7a is a schematic illustration of a cluster tool arrangement for forming a high-k dielectric.

Another embodiment of the invention includes forming the first and second dielectric layers, 110 and 120, and the metal layer 115, or other layers in an apparatus comprised of a cluster tool. In one embodiment, a cluster tool 301 comprises a multi-chambered apparatus such as schematically illustrated in FIG. 7a. The cluster tool 301 comprises a non-PVD chamber 305, such as an ALD chamber, for forming the first dielectric layer 110. It further comprises a metal deposition chamber 310, such as a PVD chamber, for forming the metal layer 115. The cluster tool 301 preferably comprises a second non-PVD chamber 315, such as an ALD chamber, for forming the second dielectric layer 120. Further included is a high-temperature annealing chamber 320, such as an RTA chamber, which preferably has an oxidizing ambient such as oxygen. Preferably, the cluster tool 301 further includes a transfer chamber 322 to permit transferring the substrate between chambers without breaking vacuum between processes. The cluster tool 301 may optionally further include a loadlock/intercooling station 325 and/or front-opening unified pod (FOUP) docking system 327.

The FOUP 327 allows for the loading and unloading of wafers without exposing the main transfer chamber 322 and process chambers to air. The pressure of FOUP docking system is usually at about 1 atm (same as the fab environment), whereas that of a main transfer chamber 322 is much lower, typically under vacuum e.g., <10 Torr. The pressure of a loadlock 325 cycles between the pressures of the docking system and the main transfer chamber. The loadlock 325 also allows for the cooling of wafers before transfer into the FOUP 327.

Figure 7B:
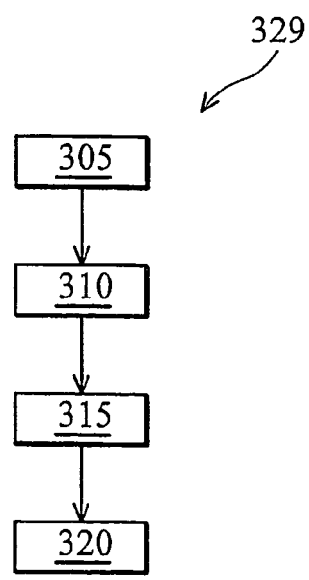

FIG. 7b illustrates an example of a chamber process sequence 329 of substrate suitable for the cluster tool 301. In one embodiment of the inventions provided above, a suitable chamber process sequence 329 may comprise: chamber 305 first (first dielectric deposition), chamber 310 second (metal deposition), chamber 315 third (second dielectric deposition), and chamber 320 fourth (anneal).

Figure 8A:
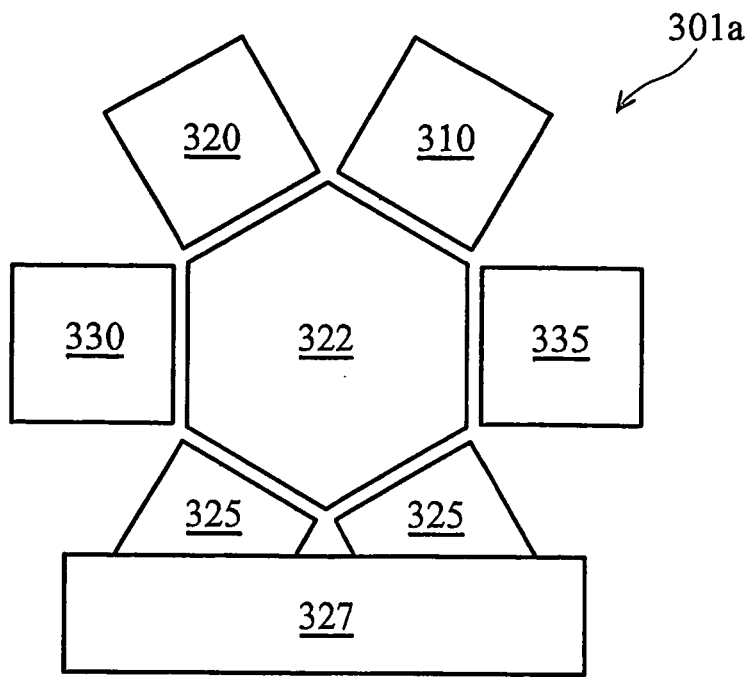
FIG. 8a is a schematic illustration of an alternative cluster tool arrangement for forming a high-k dielectric.

Other embodiments, such as illustrated in FIG. 8a, may include additional chambers for integration of subsequent semiconductor processing steps. For example, in an alternative configuration a cluster tool 301a may further comprise a metal gate deposition chamber 330. Suitable metal gate deposition methods include ALD, CVD, or PVD. Because of processing constrains, the cluster tool 301 may be configured to perform multiple processing steps in a single chamber or module. For example, in the embodiment illustrated in FIG. 8a, the first and second dielectric layers, 110 and 120, are formed in a single non-PVD chamber 335.

Figure 8B:
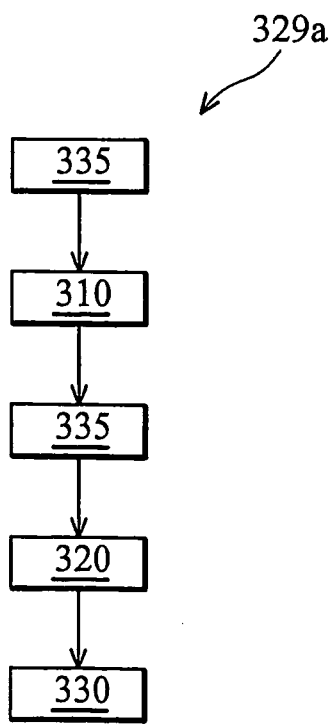

FIG. 8b illustrates an example of an alternative chamber process sequence 329b of substrate suitable for the cluster tool 301a. In one embodiment of the inventions provided above, chamber process sequence 329a may comprise: chamber 335 first (first dielectric deposition), chamber 310 second (metal deposition), chamber 335 third (second dielectric deposition), chamber 320 fourth (anneal), and chamber 330 fifth (metal gate deposition).

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a high-k dielectric layer on a substrate, the method comprising:
    forming a first dielectric layer over the substrate;
    forming a substantially nitrogen free metal layer over the first dielectric layer;
    forming a second dielectric layer over the metal layer; and
    annealing the substrate in an oxidizing ambient until the first dielectric layer, the metal layer, and the second dielectric layer combine to form a homogenous high-k dielectric layer.

2. The method of claim 1, wherein forming the first and second dielectric layers comprises a non-plasma deposition process.

3. The method of claim 2, wherein the non-plasma deposition process comprises a process selected from the group consisting essentially of atomic layer deposition (ALD), and chemical vapor deposition (CVD).

4. The method of claim 1, wherein forming the metal layer comprises plasma vapor deposition.

5. The method of claim 4, wherein the metal layer comprises a material selected from the group consisting essentially of Ti, Ta, Zr, and combinations thereof.

6. The method of claim 1, wherein the metal layer comprises at least two materials selected from the group consisting essentially of Ti, Ta, Zr, and combinations thereof.

7. The method of claim 1, wherein the first and second dielectric layers comprise a material selected from the group consisting essentially of HfSiON, $Ta_2O_5$, $TiO_2$, $Al_2O_3$, $ZrO_2$, $HfO_2$, $Y_2O_3$, $HfSiO_x$, $HfAlO_x$, $La_2O_3$, $DyScO_3$, $PbTiO_3$, $BaTiO_3$, $SrTiO_3$, $PbZrO_3$, rare-earth oxides, rare-earth scandates, aluminates and silicates thereof, and combinations thereof.

8. The method of claim 1, further comprising forming an interfacial layer between the substrate and the homogenous high-k dielectric layer, wherein the interfacial layer comprises a material selected from the group consisting essentially of SiN, SiO, $SiO_2$, SiON, Si, Hf, Al, Zr, Ti, Ta, La, Y, and combinations thereof.

9. The method of claim 1, wherein the oxidizing ambient comprises a material selected from the group consisting essentially of $O_2$, $O_3$, $N_2O$, $NO_x$, and combinations thereof.

10. The method of claim 1, wherein the homogenous high-k dielectric layer is substantially amorphous.

11. The method of claim 1, wherein annealing the substrate comprises maintaining a temperature lower than about 1000° C.

12. The method of claim 1, wherein the homogenous high-k dielectric layer comprises a first metal and a second metal, wherein an atomic ratio of the first metal to the second ratio is between about 3:7 and about 7:3.

13. A method of forming a semiconductor structure on a substrate, the method comprising:
   forming an interfacial layer over the substrate;
   forming a first high-k dielectric layer over the substrate using an atomic layer deposition (ALD) process;
   forming a non-nitrogen metal layer over the first high-k dielectric layer;
   forming a second high-k dielectric layer over the non-nitrogen metal layer using an ALD process; and
   transforming the first high-k dielectric layer, the non-nitrogen metal layer, and the second high-k dielectric layer into a substantially homogenous high-k dielectric layer.

14. The method of claim 13, wherein the transforming is performed at least in part by annealing the substrate in an oxidizing ambient until the first high-k dielectric layer, the non-nitrogen metal layer, and the second high-k dielectric layer form a homogenous high-k dielectric layer.

15. The method of claim 14, wherein the oxidizing ambient comprises a material selected from the group consisting essentially of $O_2$, $O_3$, $N_2O$, $NO_x$, and combinations thereof.

16. The method of claim 14, wherein the annealing oxidizes the first metal layer thereby forming an oxidized metal, wherein the oxidized metal has a dielectric constant equal to or greater than the first high-k dielectric layer.

17. The method of claim 13, wherein the first and second high-k dielectric layers have different respective dielectric constants.

18. The method of claim 13, wherein the first and second high-k dielectric layer comprise a material selected from the group consisting essentially HfSiON, $Ta_2O_5$, $TiO_2$, $Al_2O_3$, $ZrO_2$, $HfO_2$, $Y_2O_3$, $HfSiO_x$, $HfAlO_x$, $La_2O_3$, $DyScO_3$, $PbTiO_3$, $BaTiO_3$, $SrTiO_3$, $PbZrO_3$, rare-earth oxides, rare-earth scandates, aluminates and silicates thereof, and combinations thereof.

19. The method of claim 13, wherein the non-nitrogen metal layer comprises a first metal layer and a second metal layer.

20. The method of claim 19, wherein the first and second metal layers have a thickness ratio between about 3:7 and about 7:3.

21. The method of claim 19, wherein the first and second metal layers have a thickness ratio between about 4:6 and about 6:4.

* * * * *